United States Patent [19]
Schroder

[11] 3,979,744
[45] Sept. 7, 1976

[54] CIRCUIT ARRANGEMENT FOR THE DIGITAL CONTROL OF OPERATING FUNCTIONS VIA SENSOR ELECTRODES, ESPECIALLY IN RADIO AND TELEVISION RECEIVERS

[75] Inventor: Wolfgang Schroder, Pforzheim, Germany

[73] Assignee: International Standard Electric Corporation, New York, N.Y.

[22] Filed: Aug. 13, 1974

[21] Appl. No.: 497,169

[30] Foreign Application Priority Data
Sept. 14, 1973 Germany............................. 2346293

[52] U.S. Cl.............................. 340/324 R; 325/392; 325/398; 340/176; 340/365 R
[51] Int. Cl.².......................................... H04Q 3/42
[58] Field of Search............... 340/324 R, 325, 379, 340/162, 176, 365 R, 365 C; 325/453, 461, 464, 465, 470, 389, 390, 392, 398

[56] References Cited
UNITED STATES PATENTS

| | | | |
|---|---|---|---|
| 3,131,800 | 5/1964 | Osborne et al. ................. | 340/162 |
| 3,571,720 | 3/1971 | Heagney ........................... | 325/390 |
| 3,665,318 | 5/1972 | Hoffman et al. ................. | 325/464 |
| 3,720,876 | 3/1973 | Montgomery .................... | 325/464 |
| 3,761,945 | 9/1973 | Engle ................................. | 340/176 |
| 3,806,818 | 4/1974 | Uchiyama ......................... | 325/398 |
| 3,869,672 | 3/1975 | Schroder .......................... | 325/392 |

*Primary Examiner*—Marshall M. Curtis
*Attorney, Agent, or Firm*—John T. O'Halloran; Peter Van Der Sluys

[57] ABSTRACT

The invention provides for the digital control of the operating functions in a radio or T.V. receiver using sensor electrodes in place of mechanical control devices. A sensor control panel is provided for directly setting an electronic stepping circuit to a desired condition. The electronic stepping circuit is particularly adaptable for receiving sequential remote control signals and thereby greatly reduces the cost of adapting a receiver for remote control operation.

12 Claims, 7 Drawing Figures

CIRCUIT ARRANGEMENT FOR THE DIGITAL CONTROL OF OPERATING FUNCTIONS VIA SENSOR ELECTRODES, ESPECIALLY IN RADIO AND TELEVISION RECEIVERS

BACKGROUND OF THE INVENTION

The present invention relates to a circuit arrangement for the digital control of operating functions via sensor electrodes, especially in radio and television receivers.

Operational arrangements of the aforementioned kind serve to avoid mechanical setting procedures, to improve operational convenience by the use of sensor electrodes, and to reduce the investment otherwise involved for the connection of remote-control circuits.

It is already known to employ, for this purpose, electronic information storages and bistable flip-flop stages. Information storages are known to comprise one or more control inputs via which a sequential, in particular stepwise control of the output circuit state which is capable of being stored, can be effected either in the forward, the backward, or in both directions. The output circuit serves as the control element of the function to be performed. It may, in many cases, be considered as a digital-to-analog converter.

It is also known, via the control input of an information storage, electronic stepping switch, or ring counter capable of being forwardly controlled in n steps, to effect the resetting by respectively one step of a burst consisting of n−1 stepping pulses. This method can be used equally well for the electronic frequency setting or channel selection purpose. Further, when using known channel selection techniques, it should be noted that in electronic stepping arrangements it is customary to employ the control in the sequential manner as described hereinbefore, but also in parallel therewith, via sensor electrodes, with a direct setting of the desired storage position. The combination of these two kinds of operation, namely the direct and sequential setting of the control element is known in the art, as is the indication of the storage condition of the electronic stepping circuit, coupled thereto, by means of several signal lamps, light-emitting diodes, counter tubes, or other indicating arrangements. Moreover, it is known as electronic stepping circuits there may also be used ring counter circuits, as well as binary counting circuits employing flip-flop chains. It has proved suitable, for the channel selection in radio and television receivers, to use electronic stepping circuits having individual outputs similar to those of a ring counter, and to use for the more sensitive control of otherwise continuous operating functions, the binary encoded flip-flop chains. For the electronic stepping circuits of the first-mentioned kind, integrated switching circuits are already available which are designed, for example, to effect the switchover to four television channels with the aid of four bistable electronic switches with the inputs thereof capable of being applied to sensor electrodes, and with the outputs thereof capable of being applied to tuning potentiometers. Upon simultaneously touching a sensor electrode and the common counter electrode, the connected potentiometer is applied to the necessary voltage, and also the waverange switch of the television tuner is simultaneously connected via a second output, to the operating voltage together with the associated indicating element. Especially for remote-control purposes it is possible that in this integrated circuit the output of one stage can be connected to the successively following input of the next stage via a capacitor to form a ring counter circuit. Via one common input of all bistable electronic switches, the circuit may then be controlled in a stepwise manner with the aid of sequential pulses originating e.g. with a remote-control circuit. In the already previously mentioned binary encoded step counters, the flip-flops, however, are not brought into the desired binary combination by way of direct setting, but likewise by way of sequential control, in which case an interrogating circuit interrupts the control process upon reaching the target combination. This interrogating method as well as the not yet employed direct setting method, however, involve a considerable investment.

SUMMARY OF THE INVENTION

It is the object of the invention to provide a simple circuit in which each storage setting of the electronic stepping circuit can be directly set on a sensor control panel. The electronic sensor control of the continuous operating functions of a radio or television receiver are thus to become operable e.g. with almost the same "direct access" as e.g. a sliding control.

According to a broad aspect of the invention, there is provided a circuit arrangement for the digital control of operating functions via sensor contacts, for use in radio and television receivers comprising: a source of supply voltage; a source of a reference voltage; at least two groups of bi-stable electronic switches, one for fine adjustment and one for coarse adjustment, each group having a first output capable of being coupled to said reference source via a first input associated only with said output, each of said groups having a common control input; first and second resistors coupled to the second input of said at least two groups, the voltage drop across said first and second resistors caused by a transient current in one of the bi-stable switches whereby the outputs of all other switches are disconnected from said reference source; a plurality of resistors coupled at one end to the outputs of the bi-stable switches in said at least two groups and coupled at their output to a common point; a plurality of decoupling diodes, each coupled between the output of a bi-stable switch and one of said plurality of resistors; and a sensor control panel comprising sensor electrodes coupled to the input terminals of the bi-stable switches, said sensor electrodes divided into groups wherein the sensor electrodes occupying the same position in each group are coupled together.

The invention, in particular, offers the following advantages:

It is possible to provide direct operational access to the individual stages (also in the case of remote-control), which is performed more rapidly than in the case of shift registers. A remote-control circuit can be adapted by involving less investment than in the case of mechanical control elements. In addition thereto it is possible to use as integrated components such integrated units which are commercially available. Moreover, the invention offers the following advantages:

1. Each storage position of the electronic stepping circuit can be set directly on a sensor control panel.

2. Each storage position or each group of such storage positions is assigned one predetermined indicating signal.

3. Each of the storage positions can also be reached via special inputs with the aid of sequential pulse trains which may be derived, in particular, from remote-control circuits.

4. A certain storage position is preferred upon initial switching on.

Unlike in the conventional application for the channel switching in the case of tuners, the common control inputs of each group are not connected to one another; in fact, they are each connected to a resistor of their own. Across this resistor the switch-on current of a bistable electronic switch produces a voltage drop causing all other bistable switches of a group to be disconnected from the reference potential, so that each time only one electronic switch of each group is applied to this potential.

Moreover, and in distinction to the circuit serving the electronic channel selection, each time one bistable electronic switch of each switch group is simultaneously applied to reference potential as appearing at one output. At each output, and if so required, via a decoupling diode, there is arranged a different resistor which is led to a common connecting point.

The above and other objects of the present invention will be better understood from the following detailed description taken in conjunction with the accompanying drawings, in which:

BRIEF DESCRIPTION OF THE DRAWINGS

FIGS. 2a, 2b with respect to the same number of steps in both the forward and the backward direction, and FIG. 3 with respect to a reduced number of steps, in the backward direction.

DESCRIPTION OF THE PREFERRED EMBODIMENTS

Figure 1:
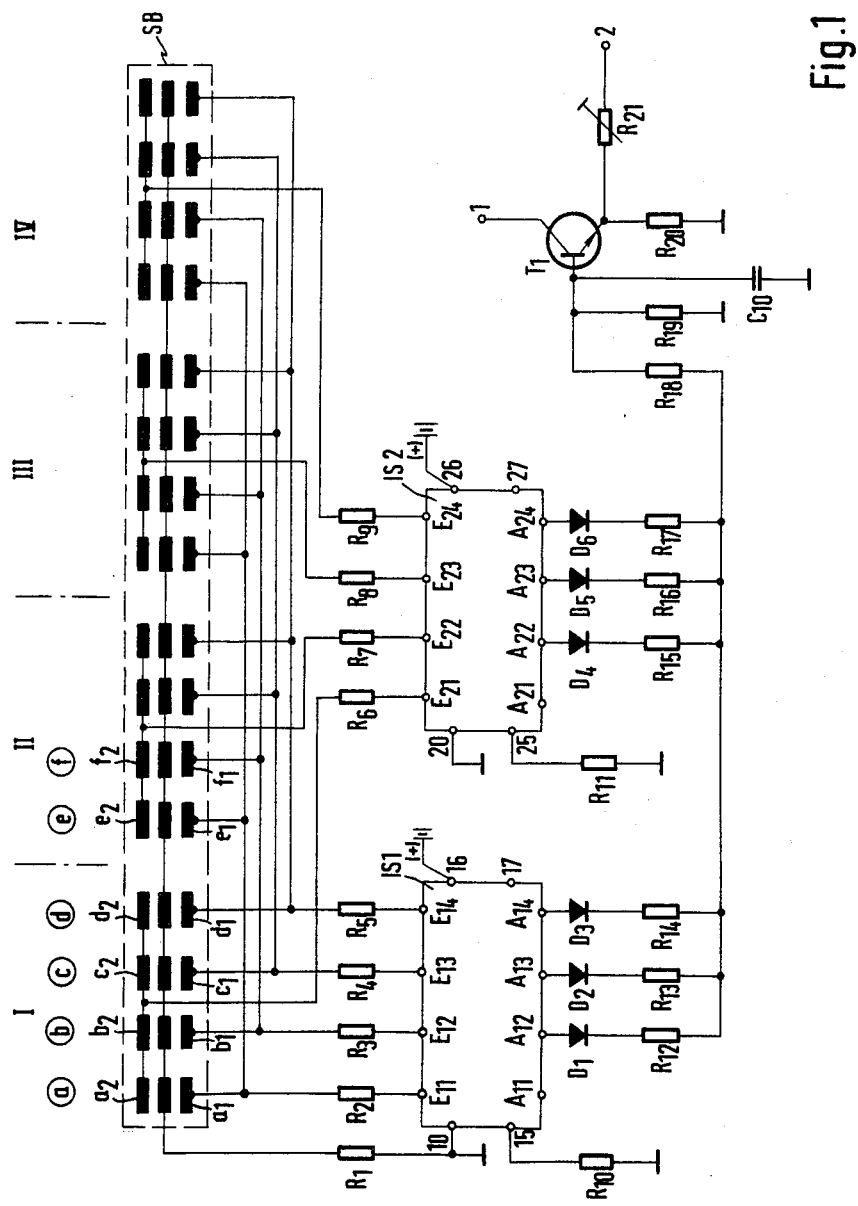
FIG. 1 shows an inventive keying circuit as well as the sensor control panel and the control element for effecting the stepwise control of an operating function (such as e.g. the sound volume), for being used directly in a receiver.

FIG. 1 shows an inventive example relating to a keying circuit for effecting direct access to the operating functions of the receiver independently of an eventually existing remote control. In detail, it shows the connection of the sensor control panel and of the control element for effecting a stepwise control of an operating function. The employed integrated circuits IS 1 for the fine adjustment and IS 2 for the coarse adjustment, may in this case be of the commercially available type, i.e. they may be employed twice as IS 1 and IS 2 under the trade name of conventional types of integrated circuits SAS 560 which, as already mentioned hereinbefore, have up to now only been used as binary flip-flop circuits and which now, by the inventive circuit, have been combined with digital-to-analog converters.

The inputs $E_{11}$ to $E_{14}$ and $E_{21}$ to $E_{24}$ are connected to the sensor control panel SB via decoupling resistors $R_2$ to $R_9$. The center electrode of the sensor control panel SB as extending through in the operating direction, is applied, across the decoupling resistor $R_1$, to the tripping reference potential 10 (ground). Accordingly, in this case the groups of sensor electrodes associated with the two switching groups, extend in parallel, when looked at spatially. As soon as three of the electrode surfaces arranged in parallel over one another, are even only momentarily touched simultaneously by the finger-tip, one switchover process each is tripped via the associated inputs in each of the two integrated circuits, i.e. in such a way that the output associated with the input, assumes the positive potential as applied to point 16 or 26 respectively. Via each time one of the decoupling diodes $D_1$ to $D_3$ and $D_4$ to $D_6$ and through each time one of the resistors $R_{12}$ to $R_{14}$ and $R_{15}$ to $R_{17}$, a combination current flows to the base electrode of transistor $T_1$, with their existing 16 different current values quite depending on the combination capable of being selected on the sensor electrodes. $R_{18}$ to $R_{21}$ serve the matching of the control function as connected to the output 2 and to be controlled, in which case $R_{17}$ is schematically shown to be the control element (e.g. the sound volume). The collector 1 is applied to the operating voltage supply. $R_{10}$ and $R_{11}$ indicate the resistors as connected to the common control input 15 or 25 of each group of electronic switches respectively, with the voltage drop thereof effecting the resetting of the not required bistable electronic switches. Of course, the decoupling resistors $R_1$ to $R_9$, in cases where a separation or interruption of the mains has not been provided for, must satisfy the pertinent safety regulations.

The upper and the lower electrodes of the sensor control panel SB are interrupted several times, e.g. the upper electrodes three times, so that there will result four groups within the sensor control panel SB.

For illustrating more distinctly the operating functions in connection with the circuit, there will now be given some examples relating to the setting (or the sensor operation) respectively. It should again be noted in this respect, that the terminals $E_{21}$ to $E_{24}$ (IS 2) are associated with the coarse adjustment, while the terminals $E_{11}$ to $E_{14}$ (IS 1) are associated with the fine adjustment.

Group I, Case No. 1

In the sensor control panel SB the first three stacked sensor electrodes — vertical electrode group $a$ — of group I are being touched or bridged by the fingertip. From this there will result the following circuit:

$a_1$. Circuit for the lower and the center electrodes $(a_1)$: ground, $R_1$, $R_2$, $E_{11}$, $A_{11}$. $A_{11}$ switches to positive potential. In this switching position no further elements are connected (to $A_{11}$), so that there is not effected a connecting through. In this case the zero position is concerned.

$a_2$. Circuit for the center and the upper electrodes $(a_2)$: ground, $R_1$, $R_6$, $E_{21}$, $A_{21}$. $A_{21}$ switches to positive potential. Since no further terminals are provided for at $A_{21}$, there is effected no further through-connection: zero position.

Accordingly, all of the first three stacked sensor electrodes of each of the groups of the sensor control panel SB, when being touched by the fingertip, will effect in the same way the zero setting.

Case No. 2

Touching of the vertical electrode group $b$

Circuit $b_1$: ground, $R_1$, $R_3$, $E_{12}$, $A_{12\,A12}$ switches to (+), a current now flows via $D_1$, $R_{12}$ and across $R_{18}$ to the base of $T_1$. In the course of this only $R_{12}$ supplies a base current (e.g. 1 mA).

Circuit $b_2$: corresponds to $a_2$, i.e. no interconnection of the coarse stage. There is only switched on the first fine-adjustment stage $b_1$.

Case No. 3

Touching of the vertical electrode group $c$

Circuit $c_1$: ground, $R_1$, $R_4$, $E_{13}$, $A_{13}$, (+) Through-connection of $D_2$ and $R_{13}$ to the base of $T_1$: switching on of the second fine-adjustment stage (e.g. 2 mA).

Circuit $c_2$: corresponds to $a_2$; no further components are interconnected.

Case No. 4

Touching of the vertical electrode group $d$

Circuit $d_1$: ground, $R_1$, $R_5$, $E_{14}$, $A_{14}$, (+) Through-connection of $D_3$ and $R_{14}$ to the base of $T_1$: switching on of the third fine-adjustment stage (e.g. 3mA).

Circuit $d_2$: corresponds to $a_2$; no further components are interconnected.

Group II, Case No. 5

Touching of the vertical electrode group $e$

Circuit $e_1$: $R_1$, $R_2$, $E_{11}$ (+), see zero position above. The fine adjustment stage is disconnected because no further circuit is connected to $A_{11}$.

Circuit $e_2$: ground, $R_1$, line extending to $R_7$, $E_{22}$. $E_{22}$ switches $A_{22}$ to (+), (+) via diode $D_4$ and $R_{15}$ to the base of $T_1$: connection of the first coarse adjustment stage (e.g. 4 mA)

Case No. 6

Touching of the vertical electrode group $f$

Circuit $f_1$: $R_1$, $f$, $R_3$, $E_{12}$, $A_{12}$, (+) (+) via $D_1$, $R_{12}$ to base of $T_1$: connection of the first fine-adjustment stage (e.g. 1 mA).

Circuit $f_2$: corresponds to $e_2$, i.e. first coarse-adjustment stage (e.g. 4 mA). Accordingly, altogether first coarse adjustment stage + first fine-adjustment stage (= 5 mA).

As is evident, there is thus now effected a further sensitively controlled connection or insertion on account of the corresponding combination fine-coarse adjustment (up to e.g. 15 mA), so that now there is reached a sequence of 16 stages.

The conductances of the resistors are to be dimensioned as follows for this purpose:

1. for the outputs of the first group with the designation of the conductance $G_{in}$ $$G_{in} = (n-1)G_o \text{ (fine control)}$$

2. for the outputs of the second group with the designation of the conductance $G_{2n}$ $$G_{2n} = (n-1)N_2 G_o \text{ (coarse control)}.$$

wherein $n$ indicates the ordinal number of the bistable electronic switch in the first group, $N_2$ indicates the number of the bistable electronic switches in the second group, and $G_o$ indicates the basic conductance which is freely selectable in accordance with the operating circuit to be controlled. For calculating a conductance $G_{mn}$ in the case of M switch groups with the ordinal number $m$ and employing $N_m$ bistable electronic switches in the $m$-th group the following applies in general:

$$G_{mn} = (n-1) \cdot e^{\sum_{m=1}^{M} \ln N_m}$$

In the known manner, the conductances form part of the matrix of the control element of the operating circuit. They may be group-wisely connected in parallel or may be arranged in filter chains as switchable base impedances.

The integrated circuits as provided for contain amplifiers, the outputs of which are in connection with the inputs of the bistable electronic switches. The inputs of the amplifiers are connected across highly resistive decoupling resistors, to the electrodes of the sensor control panel. In the case of universal (all-mains) receivers without any mains-separating provisions, the highly resistive resistors simultaneously represent the decoupling of the operator from the mains voltage and, therefore, must satisfy the pertinent safety regulation requirements.

The inventive sensor control panel contains the sensor electrodes as associated with the coarse-adjustment conductances distributed over the entire panel in the operating direction. Each of these electrodes—cyclically repeated in the operating direction—neighbors the entire group of electrodes associated with the fine-adjustment conductances, and is commonly adjacent, if so required, with one or more counter electrodes. Extensive electrode sections, of course, may also be subdivided into smaller parallel-connected areas. The electrodes associated with the various bistable electronic switch groups, including the counter electrode, may be arranged in parallel in the operating direction, i.e. in such a way that each time two electrode surfaces and, if so required, also the counter electrode, can be simultaneously bridged by the fingertip. Under the same conditions relating to the touchability, however, also all of the sensor control surface areas split up into individual electrodes, may be in one line.

Figure 2A:
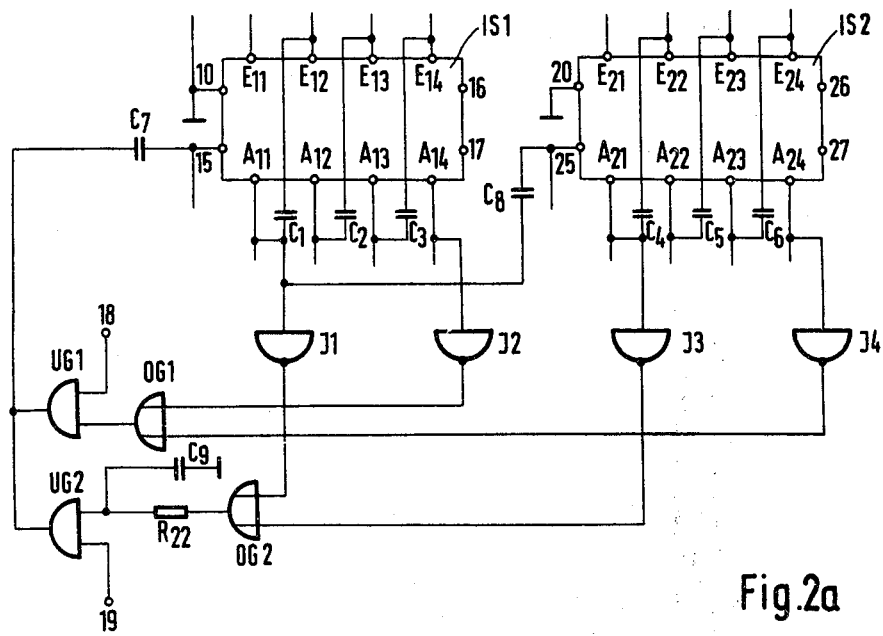
FIGS. 2a, 2b and FIG. 3 show modifications of the circuit according to FIG. 1, preferably for remote-control arrangements serving the feeding-in of sequential signals, i.e.
Figure 2B:
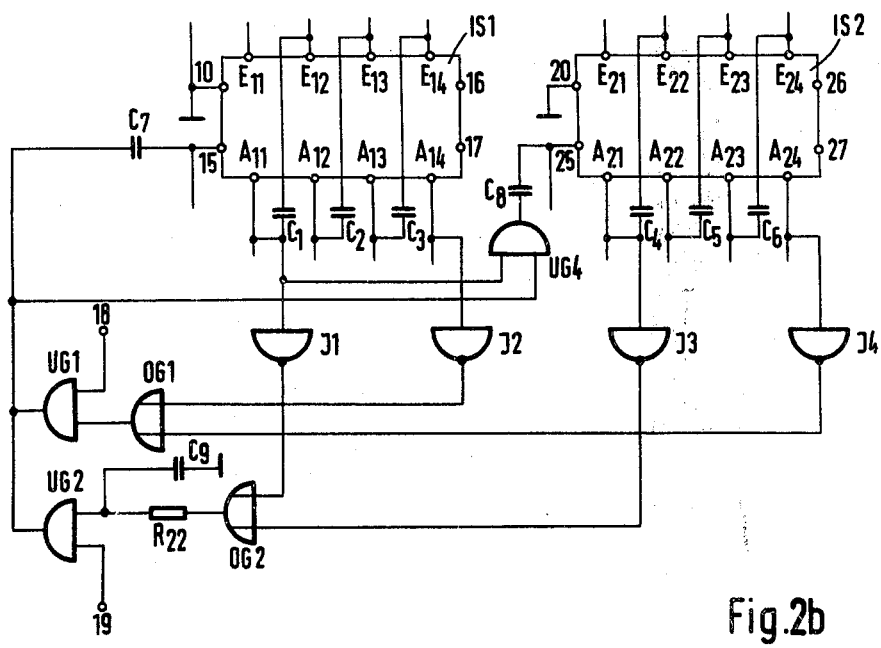

FIGS. 2a and 2b show examples of embodiment in which capacitors are used instead of the series resistors $R_{12}$ to $R_{17}$, as well as sequential circuits operating by means of capacitor recharging. The circuits according to FIGS. 2a and 2b are in particular suitable for remote control purposes. To this end they may be used in parallel with (independently of) the one shown in FIG. 1, in particular in connection with sensor control panels to be actuated directly on the receiver. Of the sensor arrangement or circuit shown in FIG. 1 which is also required in this case, there are only shown the components IS 1 and IS 2. All other components represent the additional circuit with the aid of which an additional sequential operation can be achieved, becoming necessary especially with respect to remote control circuits.

The integrated circuits IS 1 and IS 2 of the SAS 560 type, already have a preferred switch-on function taking care of that the output of the first bistable electronic switch of the group is switched to the intended reference potential upon the initial switching on. The setting to a desired switch-on condition can be effected in the manner as shown, but also with the aid of a capacitor which is discharged in the switch-off condition, with the charging current thereof producing the switch-on potential at the desired input of the bistable electronic switch upon switching on of the supply voltage. In this way also the type SAS 570 can be used without having a preferred switch-on function. Any desired switch-on function of the total circuit can be previously programmed with the preferential circuit by correspondingly connecting the aforementioned conductance combinations.

Especially with a view to remote-control purposes, the arrangement with the sensor-controlled direct selection, shall also be capable of being operated in a stepwise manner with the aid of sequential pulses. To this end a capacitor or RC-circuit is arranged between the output of each bistable electronic switch of a group and the input of the following one, which, upon disconnecting the respective output at the common control input of a group serving the connection, produces a switch-on signal for the successively following input. For this purpose there may be used e.g. a circuit of the type as already proposed by the applicant in its German Patent Application Ser. No. P 20 19 376. In order to enable the cyclical operation of such a sequential circuit it is required, as a rule, that also the last output is connected to the first input of the group via a capacitor or RC-circuit. This measure, however, may be omitted when using the integrated circuit with the built-in preferential switch-on function, because subsequently to the disconnection of the last switching step there is automatically switched on again the first switching step of the group. The sequential stepwise switching to the conductances to be combined in direction from the first to the last combination step is achieved, in accordance with the invention, as follows:

The bistable electronic switches of the first group serving to switch the fine-adjustment conductances, form part of a closed cyclical sequential circuit to the common control input of which the sequential input signals, e.g. from a remote control circuit, are applied via an AND-gate.

Likewise also the bistable electronic switches of the next group form a cyclically closed sequential circuit. They serve to switch the coarse-adjustment conductances. In this case the output signals of the first bistable electronic switch of the first group serve as the sequential input pulses at the common control input.

In cases where further switch groups are to be used, this circuit diagram of chain-connected sequential circuits may be randomly continued. As soon as, in the course of the sequential stepping on, the respective last switches in all groups have been switched to the reference potential, an "electronic limit stop" is to come into function. For this purpose the outputs of all of the last switches, if so required, in an inverted manner, are applied to the inputs of an OR-gate, via the output of which the above-mentioned AND-gate is blocked, so that now the sequential stepping pulses are interrupted.

Examples of embodiment relating to the principle of the sequential circuits as described hereinbefore, are shown in greater detail in FIGS. 2a and 2b of the drawings.

The capacitors $C_1$ to $C_3$ and $C_4$ to $C_6$ each connect the outputs $A_{11}$ to $A_{13}$ and $A_{21}$ to $A_{23}$ to the inputs $E_{12}$ to $E_{14}$ and $E_{22}$ to $E_{24}$ of the respective successively following stages. In this way each of the groups is amended to form a sequential circuit capable of being controlled at the common input 15 or 25 by sequential signals respectively. The sequential circuits are cyclically closed in each group, because the integrated circuit SAS 560 comprises an internal preference circuit which, as already mentioned hereinbefore, automatically switches on again the first switch stage after the last switch stage has been disconnected. The sequential stepping pulses are fed to the input 15 of IS 1 via $C_7$ from the output of the AND-gate UG 1. The output $A_{11}$ of the first cyclical sequential circuit IS 1, via both the capacitor $C_8$ and the input 25, controls the second cyclical sequential circuit IS 2. The sequential control pulses as generated in a remote control circuit, are applied to the one input 18 of the AND-gate UG 1. The other input is connected to the output of the OR-gate OG 1. As soon as both sequential circuits have respectively applied the last output $A_{14}$ and $A_{24}$ to the plus potential, the output of the OR-gate becomes zero, i.e. to the two inputs of which there are applied the outputs—inverted via the inverters I 2 and I 4—, thus causing the AND-gate to be blocked and reaching the electronic limit stop in the forward direction.

For effecting the stepwise resetting of the sequential circuits, the circuit will have to be amended in the following way (there may also be used e.g. the circuit as already proposed by the applicant in its earlier German Patent Application Ser. No. P 21 38 876):

The common control input of the first switch group receives from an additional AND-gate a train of sequential bursts as produced e.g. in a remote-control circuit. Each of these bursts consists of a number of pulses corresponding to the number of steps necessary for coming from one certain combination stage, via the closed cycle, to the stage lying ahead of it.

For effecting the backward control, bursts, e.g. 15-fold bursts are applied to the input 19 of the AND-gate UG 2 which, from the output of the gate, via $C_7$, are applied to the common control input 15. Each such burst effects the resetting of the cyclical sequential circuit by one combination step. As soon as the first outputs $A_{11}$ and $A_{21}$ of both groups become positive, this potential, inverted by I 1 and I 3, is applied to the inputs of the OR-gate OG 2. The output becomes zero and, delayed by $R_{22}$ and $C_9$, blocks the AND-gate UG 2. The electronic limit stop in the backward direction is reached. As already mentioned hereinbefore, absence of the delay circuit would cause a self-locking of each burst.

The number of pulses of each burst, as a rule, can be calculated from the product of the number of bistable electronic switches of each group, with the product having to be reduced by one. At one input of the additional AND-gate there is applied the burst signal, and to the other one the output of an additional OR-gate.

The number of inputs of the OR-gate corresponds to the number of employed switch groups. Each input, if so required via one inverter each, is connected to the respective first output of each switch group. After all switch groups have been switched over by the sequence signal to their first switch step, the AND-gate will block the sequence signal. In order to prevent this blocking from appearing already at each individual burst, a delay filter, in particular an RC-circuit is inserted between the output of the additional OR-gate and the input of the additional AND-gate, with the signal delay time thereof being greater than the duration of one burst.

Reducing the number of individual pulses of a burst may be of advantage for achieving a more coarse and quicker operating rhythm in the backward direction. In that case, the burst is fed into a common control input of one of the last switch groups or to the last switch group itself. At the same time, however, all groups lying ahead must be switched to the respective first switching step, for which purpose the burst is simultaneously applied to the input of each first bistable electronic switch of these groups. The number of pulses of the burst corresponds to the product of the number of electronic switches of the last switch groups.

A further matrix arrangement of the circuit or switching conditions which, according to the aforementioned arrangements, are effected via the sensor control panel, of course, is also possible with the aid of a diode matrix circuit, with so many sensor electrodes being arranged next to each other as combination steps are supposed to be actuated, and with each sensor electrode via one decoupling diode and/or one correspondingly dimensioned decoupling resistor, being in connection with each time one input of each switch group.

For suppressing switching processes during the switching of the conductance matrix it is very suitable to provide the control element with an RC or time constant, or with a low-pass filter, by which rapid variations can be sufficiently suppressed. For this purpose it is possible to insert at several points of the control element or its matching circuit, one or more capacitors.

FIG. 2b shows a circuit arrangement from which it may be taken that the first output $A_{11}$ of each bistable electronic switch group can be applied directly or indirectly, also to the input of a further AND-gate UG 4 whose output, either directly or indirectly, and especially via a capacitor $C_8$, can be connected to the common control input of the successively following switch group, while the second input thereof, either directly or indirectly, is connected to the output of the first AND-gate UG 1.

In this case, too, the bistable electronic switches of the next group form a cyclically closed sequence circuit. They serve to switch over the coarse-adjustment conductances. As sequential input pulses at the common control input there are used also in this case the output signals of the first bistable electronic switch of the first group. These pulses, however, are applied to the input of a further AND-gate before being available via the output thereof, to the control input, of course, only in the presence of the sequential operational pulses as fed-in at the second input of the AND-gate. In the absence of these operational pulses the sequence circuit may not be influenced, which would unintentionally be the case upon actuating the first senser electrode if no AND-gate were used.

The output $A_{11}$ of the first cyclical sequence circuit IS 1, when jumping to the plus potential via the AND-gate UG 4, the capacitor $C_8$ and the input 25, serves to control the second sequence circuit IS 2 as soon as pulses are applied simultaneously from the output of the AND-gate UG 1 to the second input of UG 4.

The sequential operational pulses as generated in a remote control circuit, are fed to the one input 18 of the AND-gate UG 1 whereas, as already mentioned hereinbefore, the other input is connected to the output of the OR-gate OG 1. These terminals correspond to those of the circuit according to FIG. 2a, so that the mode of operation as resulting therefrom does not need to be explained again.

Figure 3:
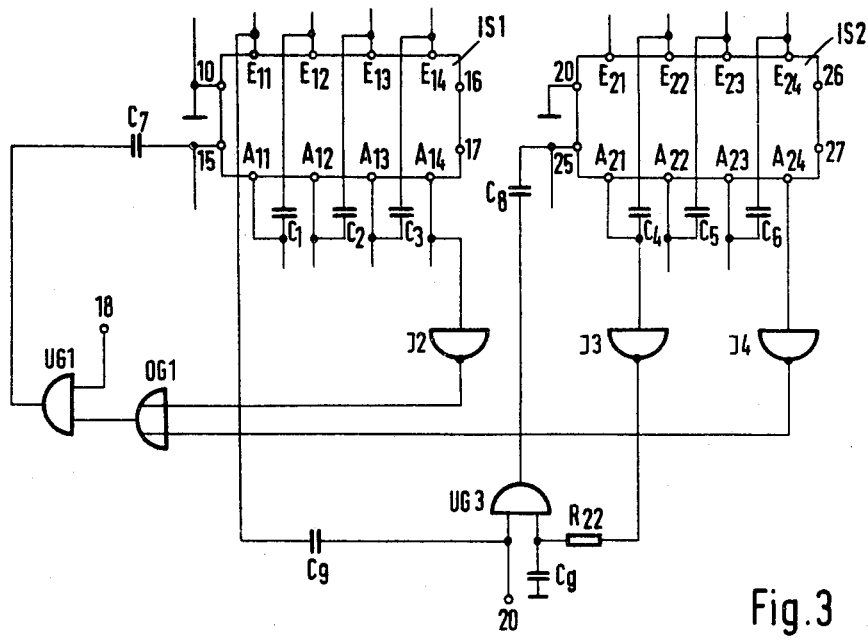

FIG. 3 is a further variant form of FIGS. 2 and 2b, and gives an example as to how the number of individual pulses of a burst can be reduced (one sequence counter may be omitted so as to enable a more rapid counting in the backward direction), for obtaining thus a more coarse and quicker operational rhythm in the backward direction.

Whereas the sequential stepping on in the forward direction functions in the unchanged manner as in FIG. 2 (feeding — in of the forward pulses via input 18), treble bursts are used for the backward setting which, via the input 20 of the AND-gate UG 3, from the output thereof via $C_8$, directly influence the input 25 of the second sequence circuit. By each burst the circuit is respectively reset by one step. By each burst, however, also the first sequence circuit or IS 1 respectively, is immediately reset to the first stage via $C_9$ at the input $E_{11}$. As soon as $A_{21}$ becomes positive, this signal will appear by being inverted with I 3 and delayed across $R_{22}$ and $C_9$, at the input of the AND-gate UG 3 which is thus blocked. The electronic limit stop is already reached after three steps in the backward direction.

Figure 4A:
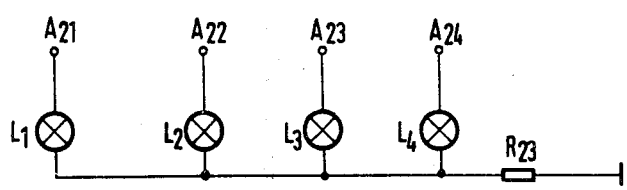
FIG. 4 shows the connection of the indicating elements,
a. for a coarse adjustment
b. for a more sensitive adjustment.
Figure 4B:
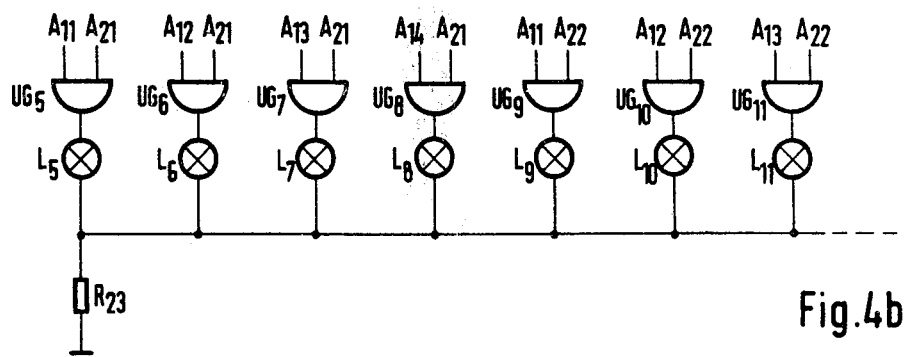

FIGS. 4a and 4b show how the inventive circuit arrangement, in a particularly favorable manner, is suitable for connecting the indicating elements.

It is known, of course, to connect signal lamps, light-emitting diodes, glow lamps or digital indicating systems directly or indirectly to the specially provided outputs of the integrated circuits. In further embodying the invention, however, there is only used the last group, or in the case of using more than two switch groups, the last groups for indicating the storage state. In many cases this coarse indication of the respective state is also completely sufficient.

In cases where all stages of the inventive circuit are supposed to indicate their respective state, the number of indicating elements will have to correspond to the product of the number of outputs of each group. Each of the indicating elements is operated at the output of one AND-gate having a number of inputs corresponding to the number of switch groups. Each gate input is connected to the output of another switch group.

The circuit according to FIG. 4a shows a type of embodiment in which the indicating elements only need to be connected to the coarse adjustment stages.

The indicating elements (light-emitting diodes or signal lamps) are connected in FIG. 4a as $L_1$ to $L_4$ alone to the outputs of the second integrated circuit IS 2 across one common resistor $R_{23}$, or else across each time one (not shown) individual resistor. According to FIG. 4b a total of altogether 16 signal elements, of which only $L_5$ to $L_{11}$ are shown, are supplied via AND-gates (UG 5 to UG 11) from the combined outputs of both integrated circuits IS 1 and IS 2.

These indicating elements, in the operational direction, may be arranged either in parallel with the control panel, in the control panel or may be visible in their illuminated state through the transparent type of control panel, i.e. in such a way that either the last touched electrode or the location of touch will remain to be marked. For this purpose, also an afterglowing material may be arranged in the vicinity of the light-emitting indicating elements.

Figure 5:
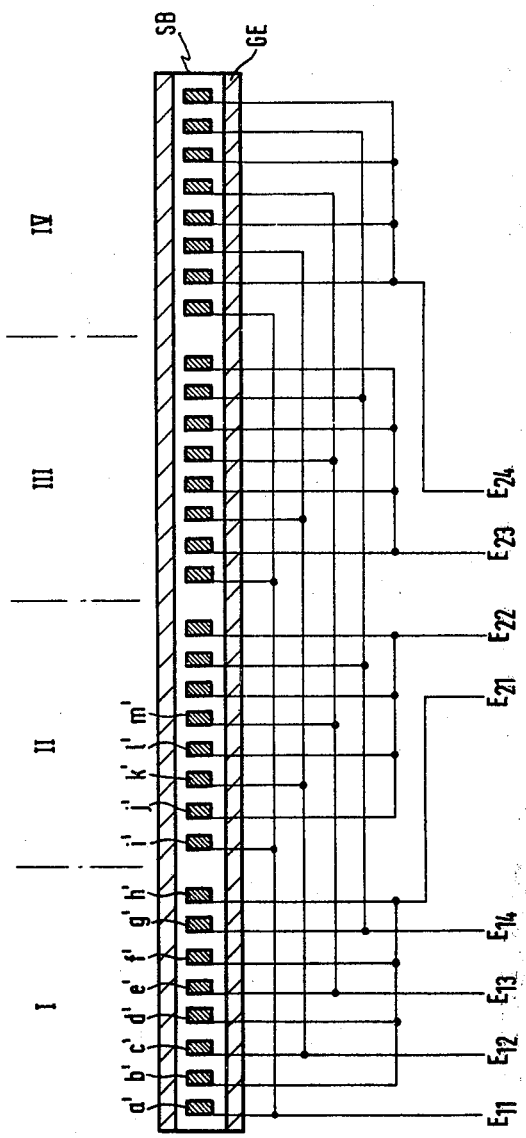
FIG. 5 shows a modified kind of electrode arrangement of a sensor control panel.

FIG. 5, finally, is an example showing that the inventive circuit arrangements are not restricted to certain types of sensor control panels (such as the one shown in FIG. 1). Incidentally, this FIG. 5 shows the arrangement of a sensor control panel in which the electrode or sensor contacts as connected to the various inputs, are arranged in the operational direction, in one line which may be either straight or form a bent curve. Each of the inputs to be combined alternate in the succession of their connection to the electrodes, and the common counter electrode GE surrounds the individual electrodes at a suitable distance. The interspaces between the electrodes may be filled with air and/or insulating material. Directly on the surface of the insulating material, slightly recessed between the touchable electrodes, and insulated therefrom, there may be arranged conductor leads applied to a blocking counter potential. These conductor leads, in cases where a humidity film is formed, are supposed to prevent the unintended operation of the circuit. In this example of embodiment, unlike in FIG. 1, not each time three vertically stacked electrodes of the sensor control panel SB, but each time two juxtaposed electrodes are bridged by the fingertip. The terminals are arranged in such a way that each time one terminal for the respective coarse adjustment stage is followed by one for the respective fine adjustment stage. Moreover, they are connected in multiple in such a way that, as the bridging continues, each time one coarse adjustment stage is combined with each time one fine-adjustment stage in such a way that a similar combination is effected as in the circuit according to FIG. 1. When bridging $a'$ and and $b'$, the contact of $a'$ will extend to $E_{11}$ (fine adjustment stage at zero) and the contact of $b'$ will extend to $E_{21}$ (coarse-adjustment stage at zero). The next bridging will result in the combination of $b'$ and $c'$. The contact of $b'$ extends to $E_{21}$ (coarse adjustment stage at zero) and the contact of $c'$ extends to $E_{12}$, i.e. by this there is switched on the first fine adjustment stage. The bridging of $d'$, $e'$ causes $d'$ to extend to $E_{21}$ (coarse adjustment at zero), and causes $e'$ to extend to $E_{13}$, i.e. setting of the second fine adjustment stage, and so forth until reaching $h'$. End of Group I. Between Groups I and II (as well as between II and III and III and IV) a considerable spacing is provided between the electrodes $h'$ and $i'$, in order thus to avoid a bridging. Upon bridging the electrodes $i'$ and $j'$ there will result with respect to $i'$ a connection to $E_{11}$, i.e. the disconnection of the fine adjustment stage, and for $j'$ there will result a connection to $E_{22}$, i.e. the switching on of the first coarse adjustment stage. Upon bridging $j'$ and $k'$, there is effected the setting via $j'$, $E_{22}$, of the first coarse adjustment stage and, via $k'$, $E_{12}$, the setting of the first fine adjustment stage, which add up to the corresponding value. The bridging of $e'$, $m'$ will provide for $1'$, $E_{22}$, the first coarse adjustment stage and will add to this, via $m'$, $E_{13}$, the value of the second fine adjustment stage.

The remaining circuit may correspond to that of FIG. 1, or to those of the other drawings.

It is to be understood that the foregoing description of specific examples of this invention is made by way of example only and is not to be considered as a limitation on its scope.

What is claimed is:

1. A circuit arrangement for the digital control of operating functions via sensor contacts, for use in radio and television receivers comprising:
   a supply voltage;
   a reference voltage;
   at least two groups of bistable electronic switches, one for fine adjustment and one for coarse adjustment, each group having a first output capable of being coupled to said reference voltage via a first input associated only with said output, each of said groups having a common control input;
   first and second resistors coupled to the second input of said at least two groups, the voltage drop across said first and second resistors caused by a transient current in one of the bistable switches whereby the outputs of all other switches are disconnected from said reference voltage;
   a plurality of resistors coupled at one end to the outputs of the bistable switches in said at least two groups and coupled at their output to a common point;
   a plurality of decoupling diodes, each coupled between the output of a bistable switch and one of said plurality of resistors; and
   a sensor control panel comprising sensor electrodes coupled to the input terminals of the bistable switches, said sensor electrodes divided into groups wherein the sensor electrodes occupying the same position in each group are coupled together.

2. A circuit arrangement according to claim 1 wherein the resistors associated with the first group have conductances in accordance with the relationship $$G_{1n} = (n-1) G_o \text{ (fine adjustment)}$$

and those of the second group have conductances in accordance with the relationship $$G_{2n} = (n-1) N_2 G_o \text{ (coarse adjustment)}$$

where $n$ indicates the original number of the $N_1$ bistable electronic switches of the first group, $N_2$ indicates the number of bistable electronic switches in the second group, and $G_o$ indicates the basic conductance.

3. A circuit arrangement according to claim 2 wherein a preferred output of at least one of the switch groups is coupled to said reference voltage via a capacitor between the supply voltage and the input of the preferred bistable electronic switch.

4. A circuit arrangement according to claim 3 further including an additional sequential remote control comprising:
   a capacitor coupled between the output of each bistable electronic switch and the input of the following switch, the last output being coupled to the first input within one switch group;
   an OR-gate having a plurality of inputs, each input coupled to the last output of each of said groups of switches;
   a source of stepping pulses; and
   a first AND-gate having an output coupled to said common control input of said first bistable electronic switch group and having a first input coupled to said source of stepping pulses and a second input coupled to the output of said OR-gate, the first output of each group of bistable switches being coupled to the common control input of the following group of switches.

5. A circuit arrangement according to claim 4 further including a second AND-gate having an output coupled to the common control input of the following groups of switches and having a first input coupled to the output of said first AND-gate and a second input coupled to the first output of each group.

6. A circuit arrangement according to claim 5 further comprising:
   a second OR-gate having a plurality of inputs corresponding in number to the number of bistable electronic switch groups with each input thereof coupled to a respective first output of each group of switches;

a third AND-gate having an output coupled to the common control input of the first group of switches and having a first input coupled to the output of said second OR-gate and having a second input coupled to a source of burst signals, said burst consisting of the product of individual pulses from the bistable electronic switches of each group reduced by at least one; and a delay filter having a delay time greater than the duration of said burst signal coupled between the output of said second OR-gate and the input of said third AND-gate.

7. A circuit arrangement according to claim 6 wherein the burst signal is fed to the common control input of the initial group of switches which effect backward control and wherein said burst signal is applied simultaneously to all first inputs of the preceding groups of switches.

8. A circuit arrangement according to claim 7 wherein the sensor control panel comprises a diode matrix.

9. A circuit arrangement according to claim 8 wherein indicating elements are connected to the preselected outputs of the electronic switches.

10. A circuit arrangement according to claim 9 wherein said indicating elements are light-emitting diodes.

11. A circuit arrangement according to claim 9 wherein said indicating elements are digital indicator tubes.

12. A circuit arrangement according to claim 9 wherein the number of indicating elements is determined by the number of possible combinations of any one output from each group of switches, said indicating element separated by an AND-gate having a number of inputs equal to the number of groups of switches.

* * * * *